United States Patent
Lee et al.

(10) Patent No.: US 8,466,729 B2
(45) Date of Patent: Jun. 18, 2013

(54) DELAY CELL AND DIGITALLY CONTROLLED OSCILLATOR

(75) Inventors: Chen-Yi Lee, Hsinchu (TW);
Chien-Ying Yu, Miaoli County (TW);
Chia-Jung Yu, Taipei (TW)

(73) Assignee: National Chiao Tung University, Hsinchu (TW)

( * ) Notice: Subject to any disclaimer, the term of this patent is extended or adjusted under 35 U.S.C. 154(b) by 44 days.

(21) Appl. No.: 13/352,350

(22) Filed: Jan. 18, 2012

(65) Prior Publication Data
US 2013/0038369 A1    Feb. 14, 2013

(30) Foreign Application Priority Data
Aug. 11, 2011    (TW) .............................. 100128747 A

(51) Int. Cl.
*H03H 11/26*    (2006.01)
(52) U.S. Cl.
USPC ............ 327/263; 327/108; 327/264; 327/278
(58) Field of Classification Search
USPC .................. 327/108–112, 263–264, 276, 278
See application file for complete search history.

(56) References Cited

U.S. PATENT DOCUMENTS

| | | |
|---|---|---|
| 4,700,089 A | 10/1987 | Fujii et al. |
| 4,952,818 A * | 8/1990 | Erdelyi et al. ................. 327/108 |
| 5,006,738 A | 4/1991 | Usuki et al. |
| 5,302,871 A | 4/1994 | Matsuzaki et al. |
| 5,986,492 A | 11/1999 | Suzuki |

OTHER PUBLICATIONS

A Monotonic Digitally Controlled Delay Element, (Nov. 2005).
An Ultra-Low—Power and Portable Digitally Controlled Oscillator for SoC Applications, (Nov. 2007).
A sub-10uW DCO Based on HDC Topologies for WBAN Applications, (Dec. 2010).

* cited by examiner

*Primary Examiner* — An Luu
(74) *Attorney, Agent, or Firm* — CKC & Partners Co., Ltd.

(57) ABSTRACT

A delay cell includes a first inverted transistor pair, a second inverted transistor pair and a plurality of delay units. The first inverted transistor pair is used to receive an input signal. The second inverted transistor pair is electrically cross-coupled to the first inverted transistor pair and cross-controlled by the first inverted transistor pair. The delay units are cascaded between the first inverted transistor pair and between the second inverted transistor pair, thereby providing a plurality of signal propagation delays sequentially, wherein the input signal is delayed for a pre-determined time by the first inverted transistor pair, the second inverted transistor pair and the delay units which are operated sequentially, thereby creating an output signal corresponding to the pre-determined time. A digitally controlled oscillator including the aforementioned delay cells is provided.

20 Claims, 9 Drawing Sheets

DELAY CELL AND DIGITALLY CONTROLLED OSCILLATOR

RELATED APPLICATIONS

This application claims priority to Taiwan Application Serial Number 100128747, filed Aug. 11, 2011, which is herein incorporated by reference.

BACKGROUND

1. Technical Field

The present disclosure relates to an electronic device, and more particularly to a delay cell and a digitally controlled oscillator.

2. Description of Related Art

A common digital phase-locked loop includes a phase frequency detector (PFD), a controller, a digitally controlled oscillator and a divider, wherein the digitally controlled oscillator utilizes a propagation path of a delay cell thereof and an inverter cell to form a feedback path, thereby creating an oscillation frequency.

A conventional delay cell may utilize signal delay characteristics of an inverter, an AND gate or a hysteresis element, to create the required delay time and the required oscillation frequency through a series-connection of multi-stage internal cells. When a wide frequency adjustment range is required, the number of series-connection stages of the internal cells in the delay cell has to be increased, so as to obtain various signal outputs with different delay times.

However, in a case that the multi-stage internal cells are connected in series (such as, series-connected inverters), the delay cell may occupy considerable power consumption in the digital phase-locked loop, which is unfavorable to actual applications. Therefore, the delay cell still has the aforementioned problems of power consumption and delay times to be overcome.

SUMMARY

The present disclosure discloses a delay cell and a digitally controlled oscillator, so that in a state of low power consumption, the time of the signal propagation delay can be increased.

An aspect of the present disclosure is to provide a delay cell including a first inverted transistor pair, a second inverted transistor pair and a plurality of delay units. The first inverted transistor pair is used to receive an input signal. The second inverted transistor pair is electrically cross-coupled to the first inverted transistor pair and is cross-controlled by the first inverted transistor pair. The delay units are cascaded between the first inverted transistor pair and between the second inverted transistor pair, thereby providing a plurality of signal propagation delays, sequentially, wherein the input signal is delayed for a pre-determined time by the first inverted transistor pair, the second inverted transistor pair and the delay units which are operated sequentially, thereby creating an output signal corresponding to the pre-determined time.

According to an embodiment of the present disclosure, the first inverted transistor pair includes a first transistor and a second transistor. The first transistor has a gate, a drain and a source. The gate of the first transistor is electrically coupled to an input end, and the source of the first transistor is electrically coupled to a relatively high level voltage. The second transistor has a gate, a drain and a source. The gate of the second transistor is electrically coupled to the input end, and the source of the second transistor is electrically coupled to a relatively low level voltage. The first transistor is a P-type transistor, and the second transistor is an N-type transistor.

According to an embodiment of the present disclosure, the second inverted transistor pair includes a third transistor and a fourth transistor. The third transistor has a gate, a drain and a source. The gate of the third transistor is electrically coupled to the drain of the second transistor, and the source of the third transistor is electrically coupled to a relatively high level voltage. The fourth transistor has a gate, a drain and a source. The gate of the fourth transistor is electrically coupled to the drain of the first transistor, and the source of the fourth transistor is electrically coupled to a relatively low level voltage. The third transistor is a P-type transistor, and the fourth transistor is an N-type transistor.

According to an embodiment of the present disclosure, the delay unit includes a first cascaded transistor pair and a second cascaded transistor pair. The first cascaded transistor pair is cascaded between the first transistor and the second transistor of the first inverted transistor pair, wherein the first cascaded transistor pair is cross-coupled to the second inverted transistor pair, and is cross-controlled by the second inverted transistor pair. The second cascaded transistor pair is cascaded between the third transistor and the fourth transistor of the second inverted transistor pair, wherein the second cascaded transistor pair is electrically coupled to the first cascaded transistor pair and an output end, and controlled by the first cascaded transistor pair.

According to an embodiment of the present disclosure, the first cascaded transistor pair includes a fifth transistor and a sixth transistor. The fifth transistor has a gate, a drain and a source. The gate of the fifth transistor is electrically coupled to the drain of the fourth transistor, and the source of the fifth transistor is electrically coupled to the drain of the first transistor and the gate of the fourth transistor. The sixth transistor has a gate, a drain and a source. The gate of the sixth transistor is electrically coupled to the drain of the third transistor, the drain of the sixth transistor is electrically coupled to the drain of the fifth transistor, and the source of the sixth transistor is electrically coupled to the drain of the second transistor and the gate of the third transistor. The fifth transistor is a P-type transistor, and the sixth transistor is an N-type transistor.

According to an embodiment of the present disclosure, the second cascaded transistor pair includes a seventh transistor and an eighth transistor. The seventh transistor has a gate, a drain and a source. The gate of the seventh transistor is electrically coupled to the fifth transistor and drain of the sixth transistor, the drain of the seventh transistor is electrically coupled to the output end, and the source of the seventh transistor is electrically coupled to the drain of the third transistor and the gate of the sixth transistor. The eighth transistor has a gate, a drain and a source. The gate of the eighth transistor is electrically coupled to the gate of the seventh transistor, the drain of the fifth transistor and the drain of the sixth transistor, the drain of the eighth transistor is electrically coupled to the drain of the seventh transistor and the output end, and the source of the eighth transistor is electrically coupled to the drain of the fourth transistor and the gate of the fifth transistor. The seventh transistor is a P-type transistor, and the eighth transistor is an N-type transistor.

According to an embodiment of the present disclosure, the delay cell further includes a bypass unit connected in parallel to cascaded transistor pairs. The bypass unit is switched to an ON state, so as to remove stored charges in the P-type transistor and the N-type transistor of each of the cascaded transistor pairs.

According to an embodiment of the present disclosure, the bypass unit includes a plurality of bypass transistors, and the bypass transistors are coupled to each other in a parallel-connection manner or a cascaded manner.

According to an embodiment of the present disclosure, the delay unit includes a plurality of cascaded transistor pairs. The cascaded transistor pairs are respectively cascaded between the first inverted transistor pair and between the second inverted transistor pair. The cascaded transistor pairs are connected in series sequentially, and a first one of the cascaded transistor pairs is cross-coupled to the second inverted transistor pair, and cross-controlled by the second inverted transistor pair. A last one of the cascaded transistor pairs is electrically coupled to the output end. Except for the last one of the cascaded transistor pairs, the rest of the cascaded transistor pairs are connected in series in a cross-coupled manner, and are cross-controlled sequentially.

According to an embodiment of the present disclosure, each of the cascaded transistor pairs includes a P-type transistor and an N-type transistor, and the P-type transistor and the N-type transistor in each of the first inverted transistor pair, the second inverted transistor pair and the cascaded transistor pairs propagate a signal in a cross manner.

According to an embodiment of the present disclosure, the delay cell further includes a bypass unit connected in parallel to the cascaded transistor pairs. The bypass unit is switched to an ON state, so as to remove stored charges in the P-type transistor and the N-type transistor of each of the cascaded transistor pairs.

According to an embodiment of the present disclosure, the bypass unit includes a plurality of bypass transistors, and the bypass transistors are coupled to each other in a parallel-connection manner or a cascaded manner.

Another aspect of the present disclosure lies in providing a delay cell, including a plurality of inverted transistor pairs and a plurality of cascaded transistor pairs. The inverted transistor pairs are connected in series in a cross-coupled manner, and are cross-controlled sequentially, wherein a first one of the inverted transistor pairs is used to receive an input signal. The cascaded transistor pairs are cascaded between the inverted transistor pairs, and the cascaded transistor pairs are connected in series sequentially. A first one of the cascaded transistor pairs is cross-coupled to a last one of the inverted transistor pairs, and is cross-controlled by the last one of the inverted transistor pairs. The inverted transistor pairs and the cascaded transistor pairs are used to provide a plurality of signal propagation delays sequentially, and the input signal is delayed for a pre-determined time by the inverted transistor pairs and the cascaded transistor pairs which are operated sequentially, for creating an output signal corresponding to the pre-determined time.

According to an embodiment of the present disclosure, each of the inverted transistor pairs and the cascaded transistor pairs includes a P-type transistor and an N-type transistor, and the P-type transistor and the N-type transistor in each of the inverted transistor pairs and the cascaded transistor pairs propagate a signal in a cross manner.

According to an embodiment of the present disclosure, the delay cell further includes a bypass unit, connected in parallel to cascaded transistor pairs. The bypass unit is switched to an ON state, so as to remove stored charges in the P-type transistor and the N-type transistor of each of the cascaded transistor pairs.

According to an embodiment of the present disclosure, the bypass unit includes a plurality of bypass transistors, and the bypass transistors are coupled to each other in a parallel-connection manner or a cascaded manner.

Still another aspect of the present disclosure lies in providing a digitally controlled oscillator, including a plurality of delay cells, wherein each of the delay cells includes a plurality of inverted transistor pairs and a plurality of cascaded transistor pairs. The inverted transistor pairs are connected in series in a cross-coupled manner, and are cross-controlled sequentially, wherein a first one of the inverted transistor pairs is used to receive an input signal. The cascaded transistor pairs are respectively cascaded between corresponding ones of the inverted transistor pairs, and the cascaded transistor pairs are connected in series sequentially. A first one of the cascaded transistor pairs is cross-coupled to a last one of the inverted transistor pairs, and is cross-controlled by the last one of the inverted transistor pairs. The inverted transistor pairs and the cascaded transistor pairs are used to provide a plurality of signal propagation delays sequentially, and the input signal is delayed for a pre-determined time by the inverted transistor pairs and the cascaded transistor pairs which are operated sequentially, for creating an output signal corresponding to the pre-determined time.

According to an embodiment of the present disclosure, each of the inverted transistor pairs and the cascaded transistor pairs includes a P-type transistor and an N-type transistor, and the P-type transistor and the N-type transistor in each of the inverted transistor pairs and the cascaded transistor pairs propagate a signal in a cross manner.

According to an embodiment of the present disclosure, the digitally controlled oscillator further includes a bypass unit connected in parallel to cascaded transistor pairs. The bypass unit is switched to an ON state, so as to remove stored charges in the P-type transistor and the N-type transistor of each of the cascaded transistor pairs.

According to an embodiment of the present disclosure, the bypass unit includes a plurality of bypass transistors, and the bypass transistors are coupled to each other in a parallel-connection manner or a cascaded manner.

Therefore, according to the application of the present disclosure, through a P/N transistor pair having a cross delay path, and in a state that P/N transistor pairs are cascaded to each other, a relatively long signal propagation delay can be achieved under the same power consumption.

BRIEF DESCRIPTION OF THE DRAWINGS

In order to make the aforementioned and other objectives, features, advantages and embodiments of the present disclosure more comprehensible, the accompanying drawings are illustrated as follows.

DETAILED DESCRIPTION

The spirit of the present disclosure is illustrated clearly below with reference to drawings and detailed description, persons having ordinary skill in the art, after understanding exemplary embodiments of the present disclosure, may make changes and modifications through technologies taught in the present disclosure, and the changes and modifications do not depart from the spirit and the scope of the present disclosure.

Figure 1A:
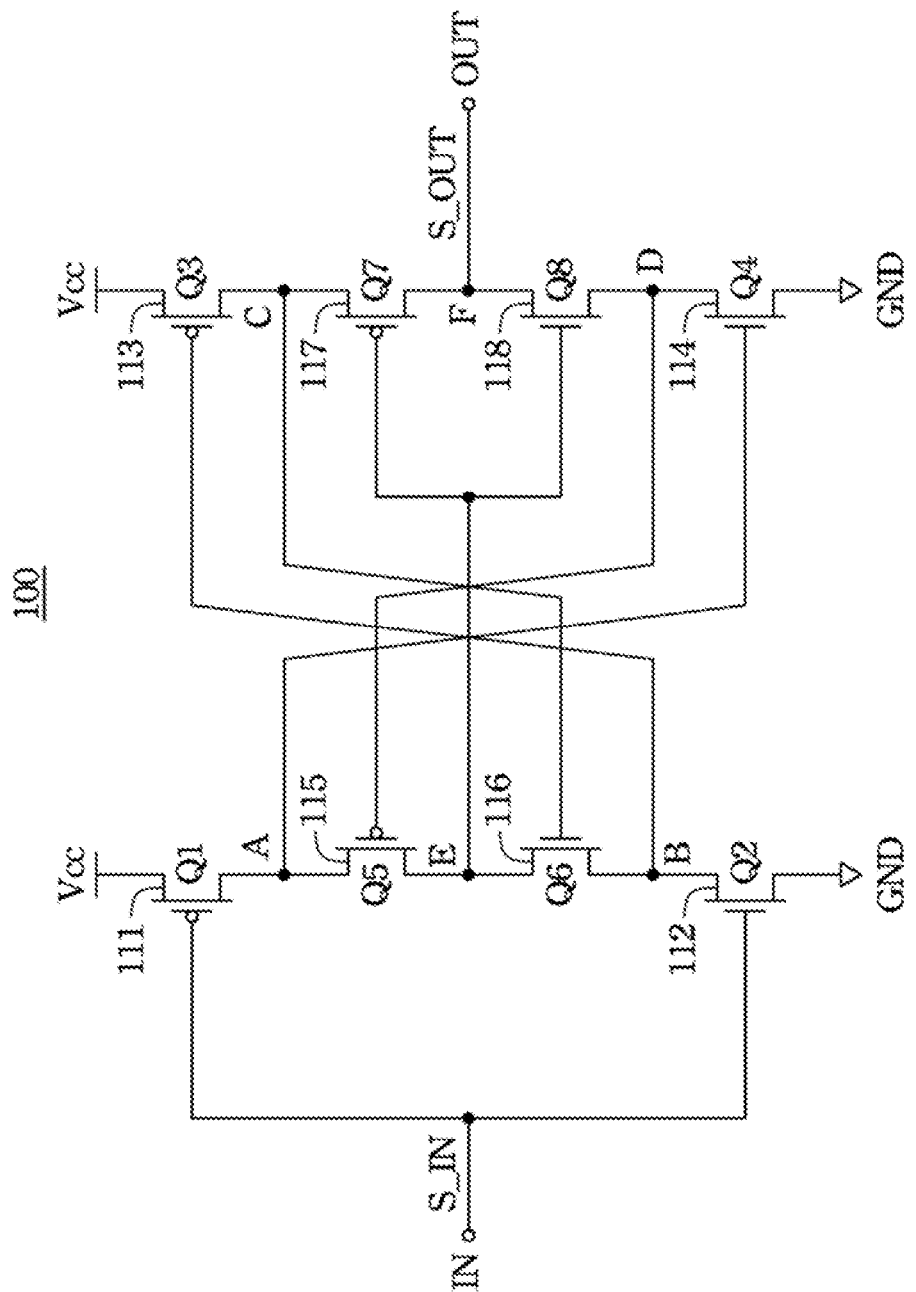
FIG. 1A is a schematic block circuit diagram of a delay cell according to an embodiment of the present disclosure.

FIG. 1A is a schematic block circuit diagram of a delay cell 100 according to an embodiment of the present disclosure. The delay cell 100 may include a first inverted transistor pair (including a first transistor 111 and a second transistor 112), a second inverted transistor pair (including a third transistor 113 and a fourth transistor 114) and a plurality of delay units (including a fifth transistor 115 to an eighth transistor 118). The first inverted transistor pair is used to receive an input signal S_IN. The second inverted transistor pair is electrically cross-coupled to the first inverted transistor pair and cross-controlled by the first inverted transistor pair. The delay units are cascaded between the first inverted transistor pair and between the second inverted transistor pair, thereby providing a plurality of signal propagation delays sequentially, wherein the input signal S_IN is delayed for a pre-determined time by the first inverted transistor pair, the second inverted transistor pair and the delay units which are operated sequentially, thereby creating an output signal S_OUT corresponding to the pre-determined time.

In an embodiment of the present disclosure, the first transistor 111 has a gate, a drain and a source. The gate of the first transistor 111 is electrically coupled to an input end (IN), and the source of the first transistor 111 is electrically coupled to a relatively high level voltage VCC (such as, a power supply end). The second transistor 112 has a gate, a drain and a source. The gate of the second transistor 112 is electrically coupled to the input end (IN), and the source of the second transistor 112 is electrically coupled to a relatively low level voltage GND (such as, a ground end). The first transistor 111 may be a P-type transistor, and the second transistor 112 may be an N-type transistor.

In an embodiment, the third transistor 113 has a gate, a drain and a source. The gate of the third transistor 113 is electrically coupled to the drain of the second transistor 112, and the source of the third transistor 113 is to electrically coupled to the relatively high level voltage VCC. The fourth transistor 114 has a gate, a drain and a source. The gate of the fourth transistor 114 is electrically coupled to the drain of the first transistor 111, and the source of the fourth transistor 114 is electrically coupled to the relatively low level voltage GND. The third transistor 113 may be a P-type transistor, and the fourth transistor 112 may be an N-type transistor.

Therefore, the first inverted transistor pair and the second inverted transistor pair are coupled between voltages VCC and GND respectively, and use a group of power paths formed from the voltages VCC and GND respectively to perform operation according to ON currents provided by their corresponding power paths respectively.

In an embodiment of the present disclosure, the delay units may include a first cascaded transistor pair (including a fifth transistor 115 and a sixth transistor 116) and a second cascaded transistor pair (including a seventh transistor 117 and an eighth transistor 118). The first cascaded transistor pair is cascaded between the first transistor 111 and the second transistor 112 of the first inverted transistor pair, wherein the first cascaded transistor pair is cross-coupled to the second inverted transistor pair, and is cross-controlled by the second inverted transistor pair. The second cascaded transistor pair is cascaded between the third transistor 113 and the fourth transistor 114 of the second inverted transistor pair, wherein the second cascaded transistor pair is electrically coupled to the first cascaded transistor pair and an output end (OUT), and is controlled by the first cascaded transistor pair.

In an embodiment, the fifth transistor 115 has a gate, a drain and a source. The gate of the fifth transistor 115 is electrically coupled to the drain of the fourth transistor 114, and the source of the fifth transistor 115 is electrically coupled to the drain of the first transistor 111 and the gate of the fourth transistor 114. The sixth transistor 116 has a gate, a drain and a source. The gate of the sixth transistor 116 is electrically coupled to the drain of the third transistor 113, the drain of the sixth transistor 116 is electrically coupled to the drain of the fifth transistor 115, and the source of the sixth transistor 116 is electrically coupled to the drain of the second transistor 112 and the gate of the third transistor 113. The fifth transistor 115 may be a P-type transistor, and the sixth transistor 116 may be an N-type transistor.

In an embodiment, the seventh transistor 117 has a gate, a drain and a source. The gate of the seventh transistor 117 is electrically coupled to the drain of the fifth transistor 115 and the drain of the sixth transistor 116, the drain of the seventh transistor 117 is electrically coupled to the output end, and the source of the seventh transistor 117 is electrically coupled to the drain of the third transistor 113 and the gate of the sixth transistor 116. The eighth transistor 118 has a gate, a drain and a source. The gate of the eighth transistor 118 is electrically coupled to the gate of the seventh transistor 117, the drain of the fifth transistor 115 and the drain of the sixth transistor 116, the drain of the eighth transistor 118 is electrically coupled to the drain of the seventh transistor 117 and the output end, and the source of the eighth transistor 118 is electrically coupled to the drain of the fourth transistor 114 and the gate of the fifth transistor 115. The seventh transistor 117 may be a P-type transistor, and the eighth transistor 118 may be an N-type transistor.

Therefore, the first transistor 111 to the eighth transistor 118 may share two groups of power paths formed from the voltages VCC and GND with the first inverted transistor pair and the second inverted transistor pair respectively, and perform operation according to ON currents provided by their corresponding power paths respectively.

For example, if the input end receives a low voltage level input signal S_IN, this low voltage level input signal S_IN enables the first transistor 111 to be turned on. Meanwhile, a node A is pulled up to a high voltage level, and enables the fourth transistor 114 to be turned on. Thereafter, a node D is pulled down to a low voltage level, and enables the fifth transistor 115 to be turned on. Then, a node E is pulled up to a high voltage level, and enables the eighth transistor 118 to be turned on. Subsequently, a node F is pulled down to a low voltage level, and outputs a low voltage level output signal S_OUT. Therefore, the first transistor 111, the fourth transistor 114, the fifth transistor 115 and the eighth transistor 118 provide time of four signal propagation delays, such that after the input signal S_IN is delayed by the time of four signal propagation delays, a corresponding output signal S_OUT is outputted through the output end.

Similarly, if the input end receives a high voltage level input signal S_IN, this high voltage level input signal S_IN enables the second transistor 112 to be turned on. Meanwhile, a node B is pulled down to a low voltage level, and enables the third transistor 113 to be turned on. Thereafter, a node C is pulled up to a high voltage level, and enables the sixth transistor 116 to be turned on. Then, the node E is pulled down to a low voltage level, and enables the seventh transistor 117 to be turned on. Subsequently, the node F is pulled up to a high voltage level, and outputs a high voltage level output signal S_OUT. Therefore, the second transistor 112, the third transistor 113, the sixth transistor 116 and the seventh transistor 117 provide time of four signal propagation delays, such that after the input signal S_IN is delayed by the time of four signal propagation delays, a corresponding output signal S_OUT is outputted through the output end.

Therefore, by increasing or decreasing the number of cascading stages of the delay units, signal propagation delay time becomes controllable, and the delay units share two groups of power paths formed from VCC and GND with the first inverted transistor pair and the second inverted transistor pair respectively, such that power consumption does not increase along with the increase of the number of cascading stages of the delay units.

Figure 1B:
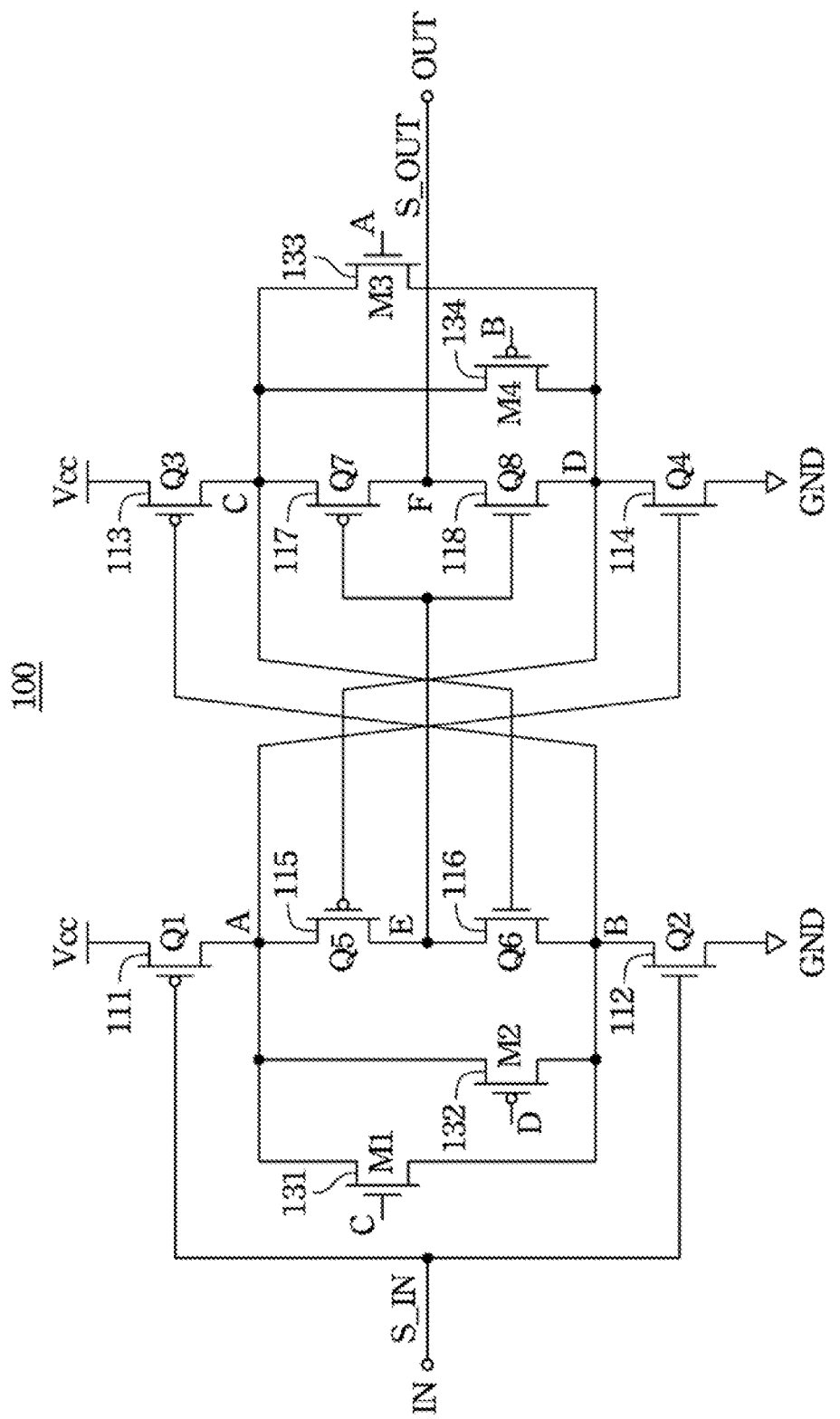
FIG. 1B is a schematic block circuit diagram of a delay cell having a bypass unit according to an embodiment of the present disclosure.
Figure 1C:
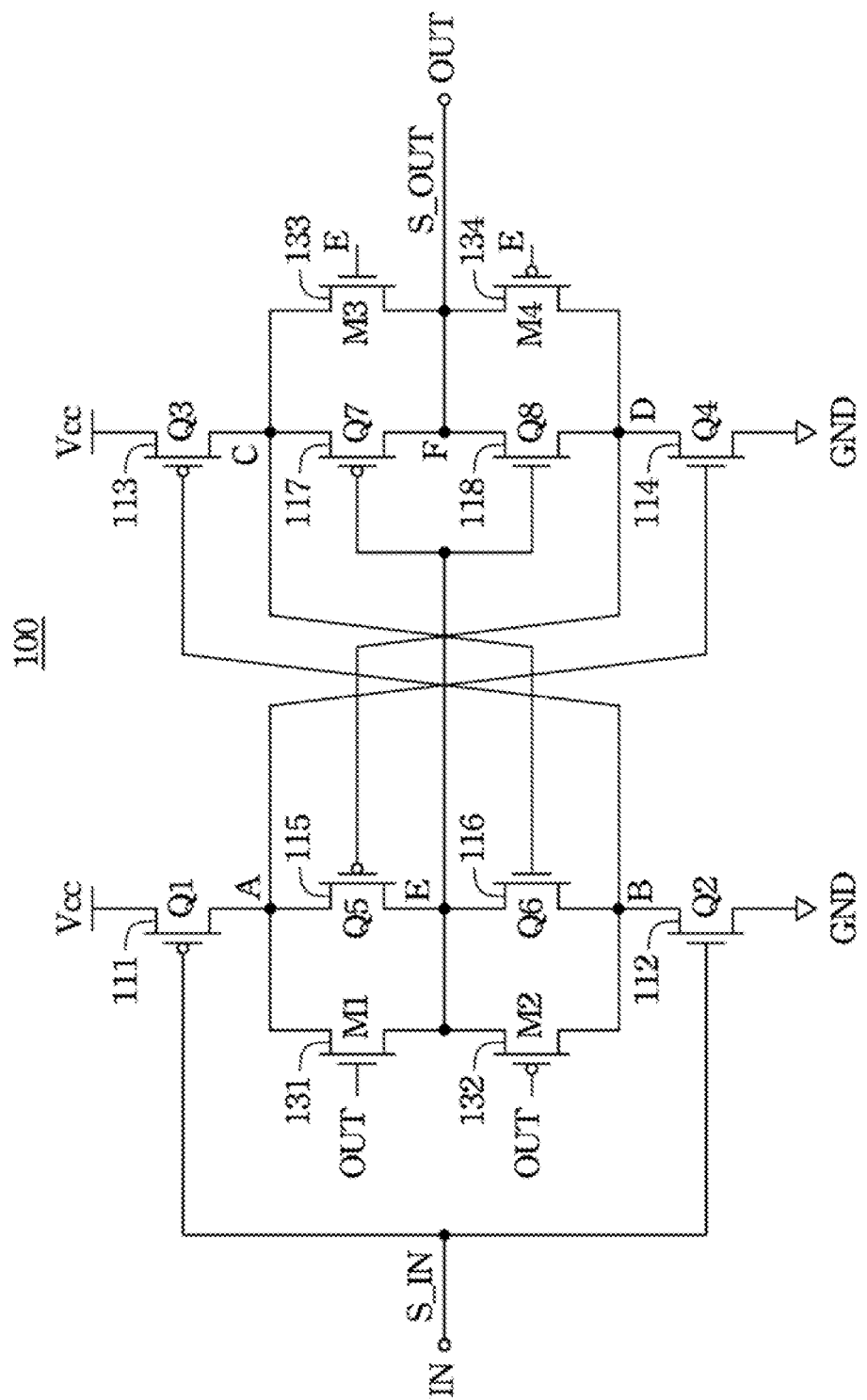
FIG. 1C is a schematic block circuit diagram of a delay cell having a bypass unit according to an embodiment of the present disclosure.

FIG. 1B and FIG. 1C are schematic block circuit diagrams showing a delay cell 100 having a bypass unit according to embodiments of the present disclosure. The delay cell 100 may further include a bypass unit (including a first bypass transistor 131 to a fourth bypass transistor 134), and the bypass unit is connected in parallel to a cascaded transistor pair (including a fifth transistor 115 to an eighth transistor 118). When the bypass unit is switched to an ON state, the bypass unit may remove stored charges in P-type transistors (the fifth transistor 115 and the seventh transistor 117) and N-type transistors (the sixth transistor 116 and the eighth transistor 118) of the cascaded transistor pair. In an embodiment, the first bypass transistor 131 to the fourth bypass transistor 134 are coupled to each other in a parallel-connection manner or cascaded manner.

As shown in FIG. 1B, the first bypass transistor 131 to the fourth bypass transistor 134 are coupled to each other in a parallel-connection manner, and are used to remove stored charges in the node A, the node B, the node C and the node D respectively, so that the fifth transistor 115 to the eighth transistor 118 may change their states along with the changes of voltage levels of their gates. In this embodiment, the first bypass transistor 131 is controlled by the voltage level of the node C, and the second bypass transistor 132 is controlled by the voltage level of the node D, and the third bypass transistor 133 is controlled by the voltage level of the node A, and the fourth bypass transistor 134 is controlled by the voltage level of the node B.

As shown in FIG. 1C, the first bypass transistor 131 to the fourth bypass transistor 134 are coupled to each other in a cascaded manner, and are used to remove stored charges in the node A, the node B, the node C and the node D respectively, so that the fifth transistor 115 to the eighth transistor 118 may change their states along with the changes of voltage levels of their gates. In this embodiment, the first bypass transistor 131 is controlled by the voltage level of the output end, and the second bypass transistor 132 is controlled by the voltage level of the output end, and the third bypass transistor 133 is controlled by the voltage level of the node E, and the fourth bypass transistor 134 is controlled by the voltage level of the node E.

Figure 2A:
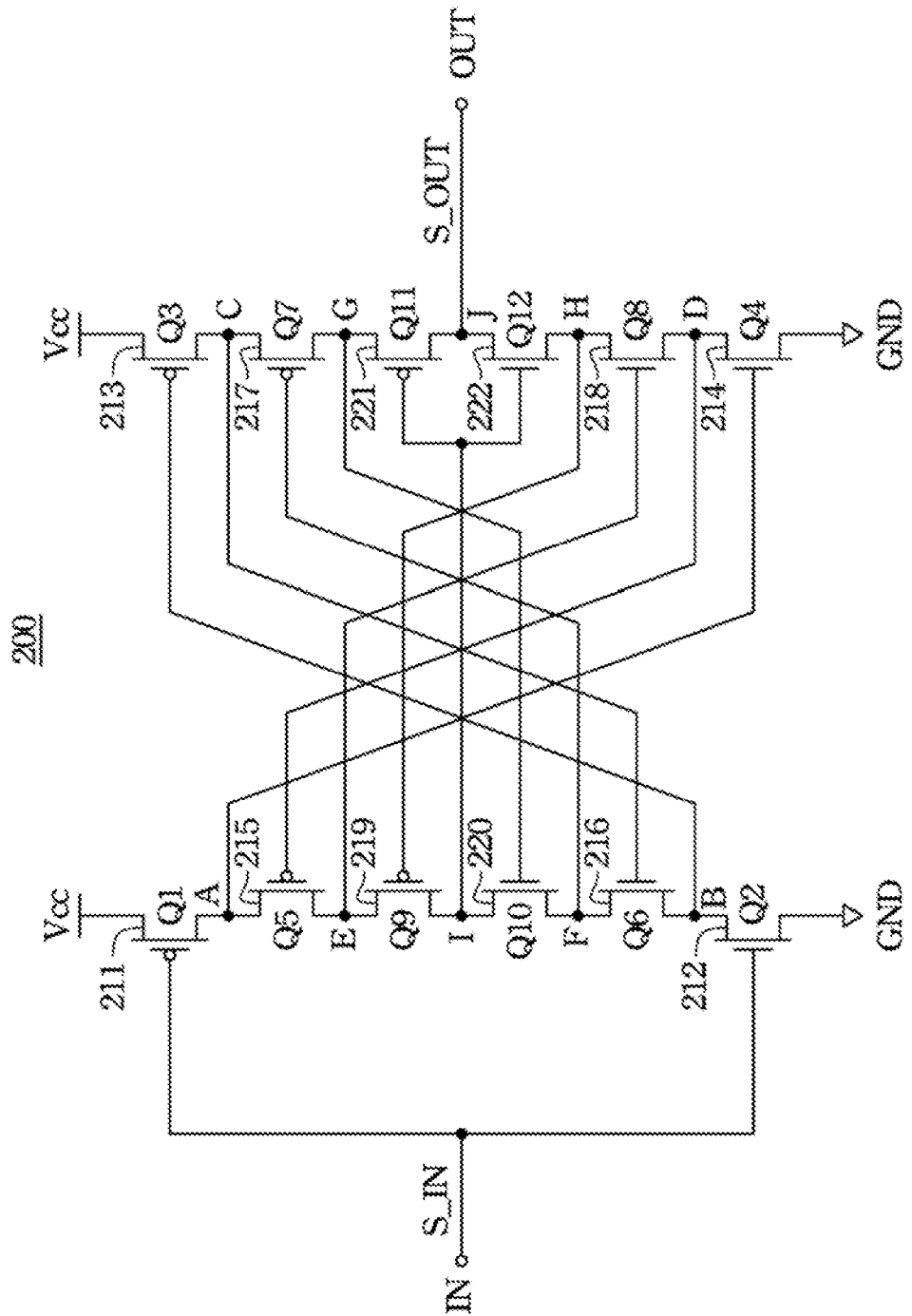
FIG. 2A is a schematic block circuit diagram of a delay cell according to an embodiment of the present disclosure.

FIG. 2A is a schematic block circuit diagram showing a delay cell 200 according to an embodiment of the present disclosure. In an embodiment of the present disclosure, delay units may include a plurality of cascaded transistor pairs, such as a first cascaded transistor pair (including a fifth transistor 215 and a sixth transistor 216), a second cascaded transistor pair (including a seventh transistor 217 and an eighth transistor 218), a third cascaded transistor pair (including a ninth transistor 219 and a tenth transistor 220), and a fourth cascaded transistor pair (including an eleventh transistor 221 and a twelfth transistor 222). The cascaded transistor pairs are cascaded between a first inverted transistor pair (including a first transistor 211 and a second transistor 212) and between a second inverted transistor pair (including a third transistor 213 and a fourth transistor 214) respectively. The cascaded transistor pairs may be connected in series sequentially, and a first one (the first cascaded transistor pair) of the cascaded transistor pairs is cross-coupled to the second inverted transistor pair, and is cross-controlled by the second inverted transistor pair. A last one (the fourth cascaded transistor pair) of the cascaded transistor pairs is electrically coupled to an output end. Except for the last one (the fourth cascaded transistor pair) of the cascaded transistor pairs, the rest of the cascaded transistor pairs are connected in series in a cross-coupled manner, and are cross-controlled sequentially.

For example, the first cascaded transistor pair is cascaded between the first inverted transistor pair, and the third cascaded transistor pair is cascaded between the first cascaded transistor pair. Similarly, the second cascaded transistor pair is cascaded between the second inverted transistor pair, and the fourth cascaded transistor pair is cascaded between the second cascaded transistor pair. In addition, the second inverted transistor pair is cross-coupled to the first cascaded transistor pair, the first cascaded transistor is cross-coupled to the second cascaded transistor pair, the second cascaded transistor pair is cross-coupled to the third cascaded transistor pair, the third cascaded transistor pair is electrically coupled to the fourth cascaded transistor pair, and the fourth cascaded transistor pair is electrically coupled to the output end.

Therefore, the first cascaded transistor pair to the fourth cascaded transistor pair may share two groups of power paths formed from the voltages VCC and GND with the first inverted transistor pair and the second inverted transistor pair respectively, and operate according to ON currents provided by corresponding power paths respectively.

In this embodiment, each of the cascaded transistor pairs includes a P-type transistor (such as, the fifth transistor 215, the seventh transistor 217, the ninth transistor 219 and the eleventh transistor 221) and an N-type transistor (such as, the sixth transistor 216, the eighth transistor 218, the tenth transistor 220 and the twelfth transistor 222), and P-type transistors and N-type transistors in the first inverted transistor pair, the second inverted transistor pair and the cascaded transistor pair propagate a signal in a cross manner. That is, the P-type transistors and N-type transistors in the first inverted transistor pair, the second inverted transistor pair and the cascaded transistor pair will not be turned on simultaneously, and control a different type transistor of the next stage in a cross manner (for example, the output of an N-type transistor controls a P-type transistor of the next stage, or the output of a P-type transistor controls a N-type transistor of the next stage) to propagate a signal.

In operation, if the input end receives a low voltage level input signal S_IN, this low voltage level input signal S_IN enables the first transistor 211 to be turned on. Meanwhile, a node A is pulled up to a high voltage level, and enables the fourth transistor 214 to be turned on. Thereafter, a node D is pulled down to a low voltage level, and enables the fifth transistor 215 to be turned on. Then, a node E is pulled up to a high voltage level, and enables the eighth transistor 218 to be turned on. Subsequently, the node H is pulled down to a low voltage level, and enables the ninth transistor 219 to be turned on. Thereafter, a node I is pulled up to a high voltage level, and enables the twelfth transistor 222 to be turned on. Then, a node J is pulled down to a low voltage level, and outputs a low voltage level output signal S_OUT. Therefore, the first transistor 211, the fourth transistor 214, the fifth transistor 215, the eighth transistor 218, the ninth transistor 219 and the twelfth transistor 222 provide time of six signal propagation delays, so that after the input signal S_IN is delayed by the time of six signal propagation delays, a corresponding output signal S_OUT is output through the output end.

By the same token, if the input end receives a high voltage level input signal S_IN, the operation manner of the signal propagation of this embodiment is also the same as or similar to that in the foregoing embodiment, and thus is not described again herein. It can be known from this description that, the second transistor 212, the third transistor 213, the sixth transistor 216, the seventh transistor 217, the tenth transistor 220 and the eleventh transistor 221 also provide time of six signal propagation delays, so that after the input signal S_IN is delayed by the time of six signal propagation delays, a corresponding output signal S_OUT is output through the output end.

It should be noted that, in this embodiment, multiple cascaded transistors are used to increase the number of series-connection stages of the transistors in a perpendicularly cascaded manner, thereby increasing the signal propagation delay time is increased, and the multiple cascaded transistors may share two groups of power paths formed from the voltages VCC and GND with the first inverted transistor pair and the second inverted transistor pair, without additionally consuming power, thereby achieving efficacies of low power consumption and long delay.

Figure 2B:
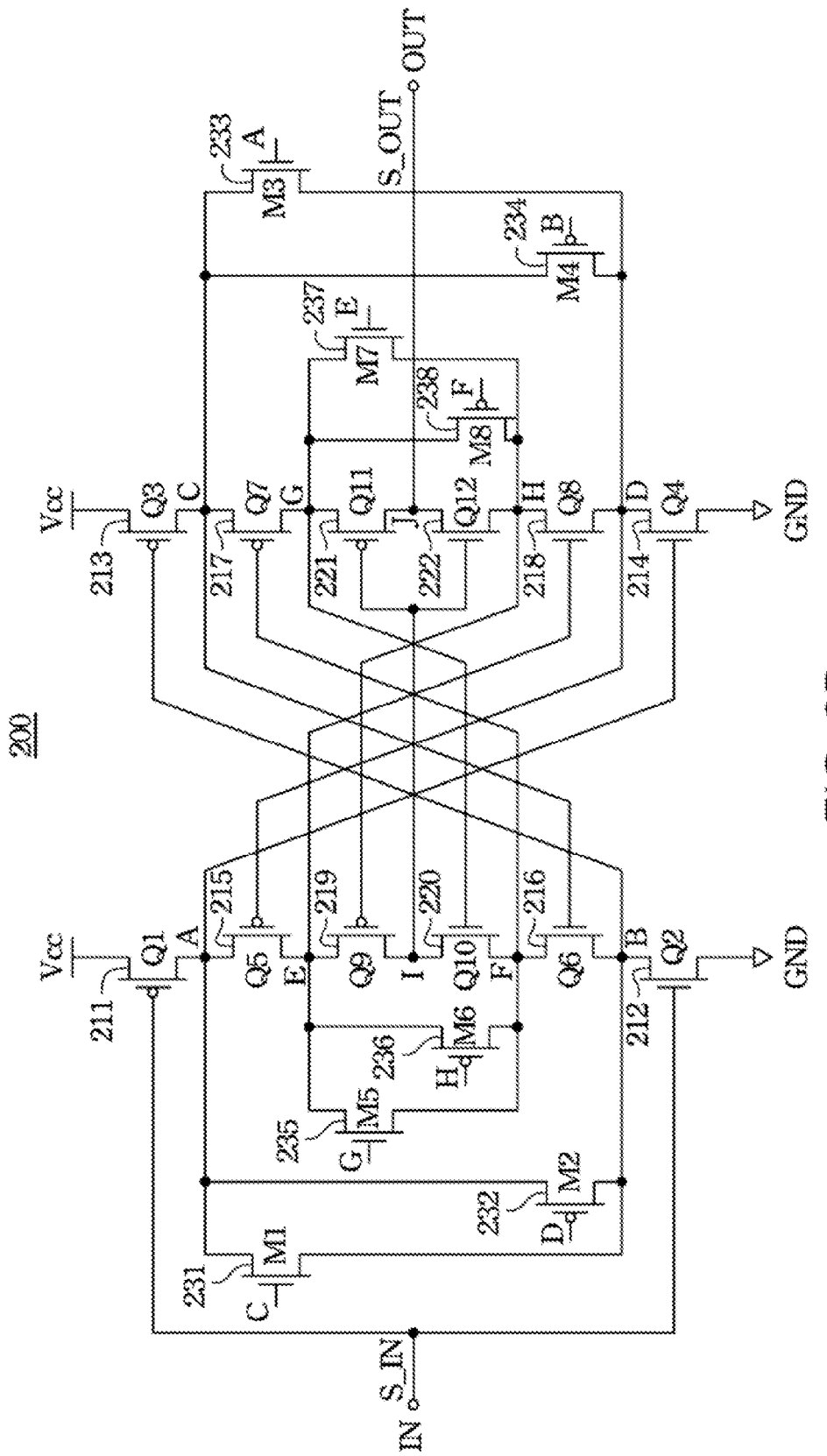
FIG. 2B is a schematic block circuit diagram of a delay cell having a bypass unit according to an embodiment of the present disclosure.
Figure 2C:
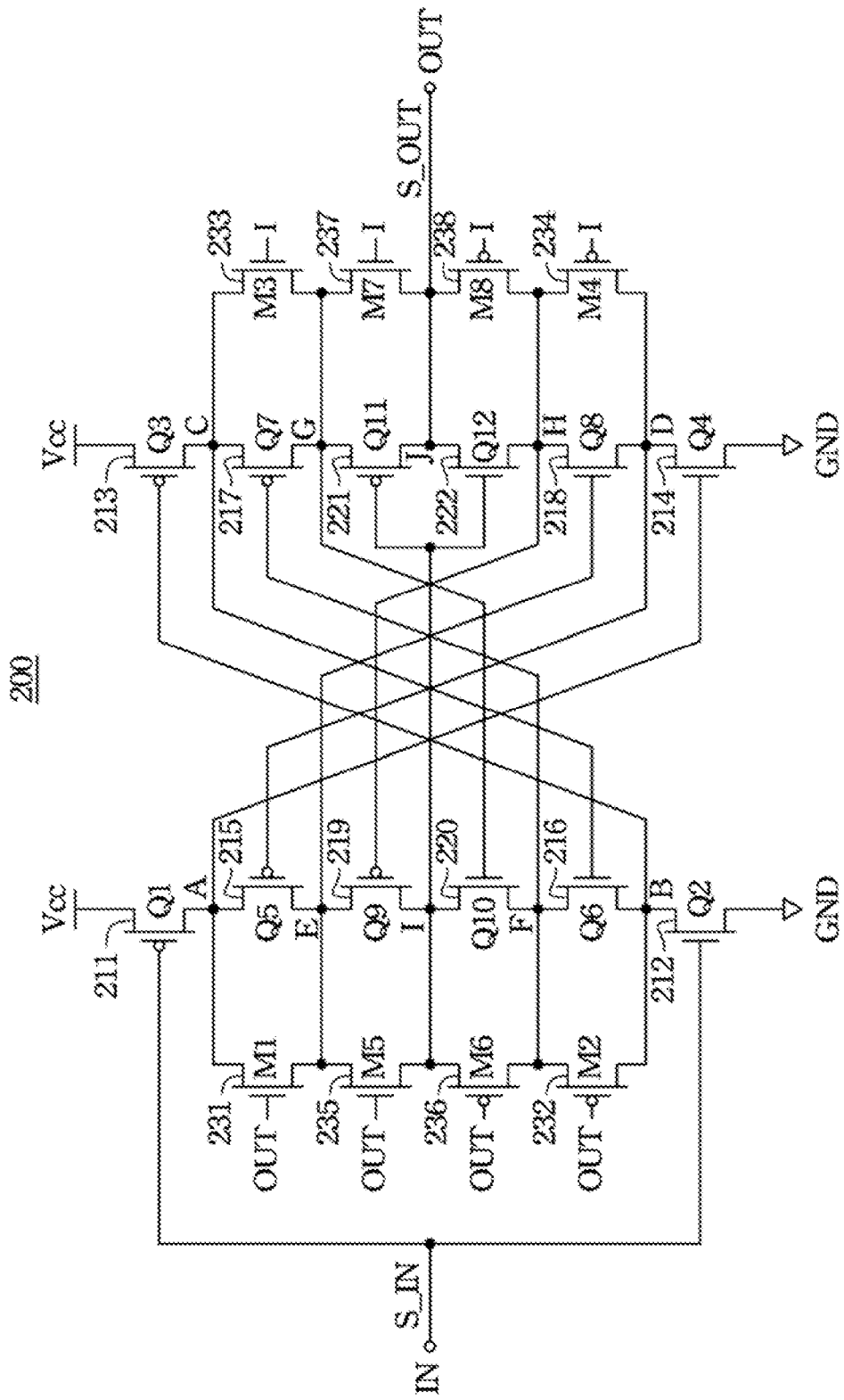
FIG. 2C is a schematic block circuit diagram of a delay cell having a bypass unit according to an embodiment of the present disclosure.

FIG. 2B and FIG. 2C are schematic circuit block diagrams showing a delay cell 200 having a bypass unit according to embodiments of the present disclosure. Similar to the delay cell 100 shown in FIG. 1B and FIG. 1C, the delay cell 200 may further include a bypass unit (including a first bypass transistor 231 to an eighth bypass transistor 238), and the bypass unit is connected in parallel to a cascaded transistor pair (including a fifth transistor 215 to a twelfth transistor 222). When the bypass unit is switched to an ON state, the bypass unit may remove stored charges in the P-type transistor and the N-type transistor of each of the cascaded transistor pairs. In an embodiment, the first bypass transistor 231 to the eighth bypass transistor 238 are coupled to each other in a parallel-connection manner or cascaded manner.

As shown in FIG. 2B, the first bypass transistor 231 to the eighth bypass transistor 238 are coupled to each other in a parallel-connection manner, and the operation manner of this embodiment for removing the stored charges is the same as or similar to that of the embodiment shown in FIG. 1B, and thus is not described again herein.

As shown in FIG. 2C, the first bypass transistor 231 to the eighth bypass transistor 238 are coupled to each other in a cascaded manner, and the operation manner of this embodiment for removing the stored charges is the same as or similar to that of the embodiment shown in FIG. 1C, and thus is not described again herein.

Figure 3:
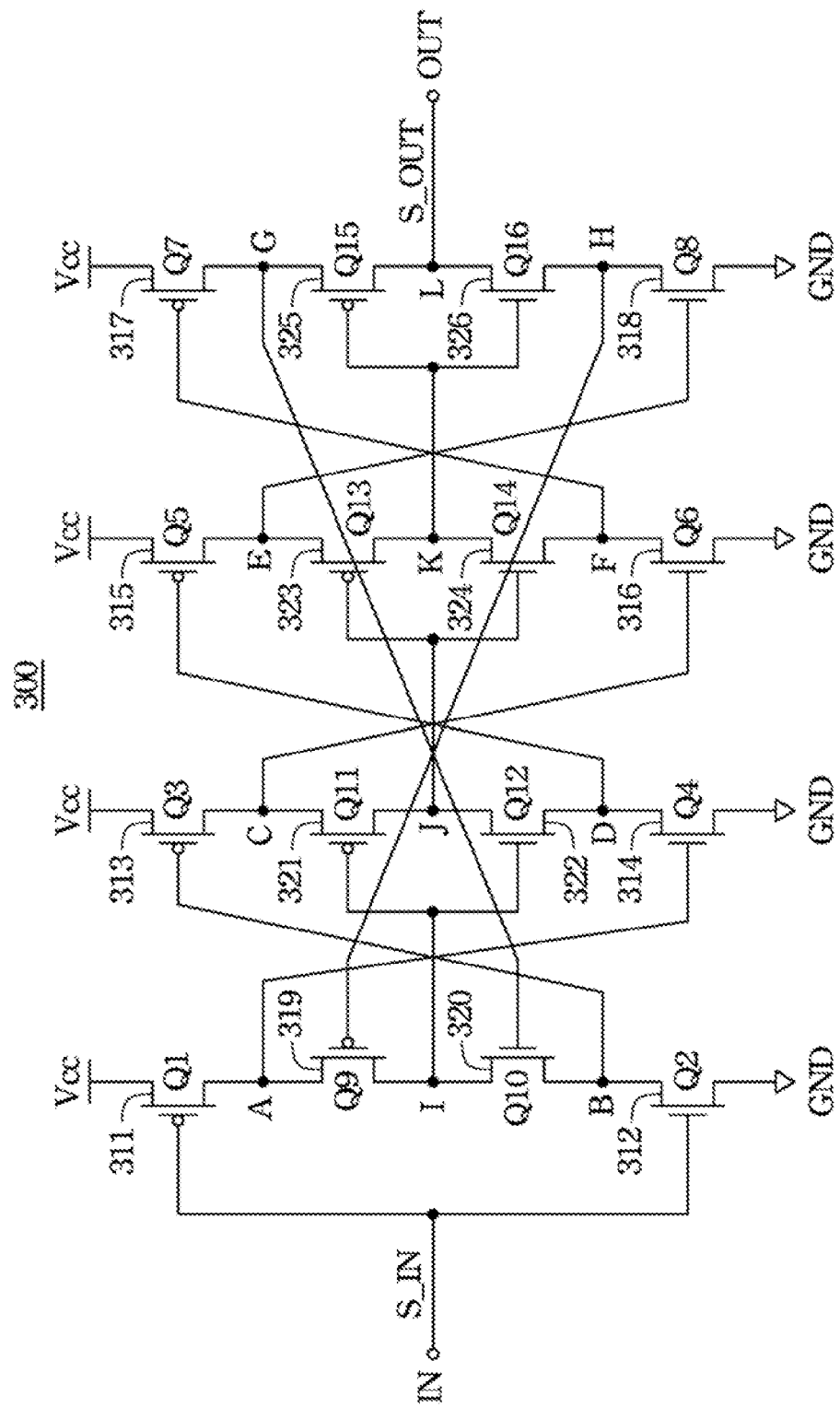
FIG. 3 is a schematic block circuit diagram of a delay cell according to an embodiment of the present disclosure.

FIG. 3 is a schematic block circuit diagram of a delay cell 300 according to an embodiment of the present disclosure. The delay cell 300 includes a plurality of inverted transistor pairs, such as a first inverted transistor pair (including a first transistor 311 and a second transistor 312), a second inverted transistor pair (including a third transistor 313 and a fourth transistor 314), a third inverted transistor pair (including a fifth transistor 315 and a sixth transistor 316) and a fourth inverted transistor pair (including a seventh transistor 317 and an eighth transistor 318) and a plurality of cascaded transistor pairs, such as a first cascaded transistor pair (including a ninth transistor 319 and a tenth transistor 320), a second cascaded transistor pair (including an eleventh transistor 321 and a twelfth transistor 322), a third cascaded transistor pair (including a thirteenth transistor 323 and a fourteenth transistor 324) and a fourth cascaded transistor pair (including a fifteenth transistor 325 and a sixteenth transistor 326).

The aforementioned inverted transistor pairs are connected in series in a cross-coupled manner, and are cross-controlled sequentially, wherein a first one (the first inverted transistor pair) of the inverted transistor pairs is used to receive an input signal S_IN. The cascaded transistor pairs may be cascaded between the inverted transistor pairs, and the cascaded transistor pairs are connected in series sequentially. The first one (the first cascaded transistor pair) of the cascaded transistor pairs is cross-coupled to the last one (the fourth inverted transistor pair) of the inverted transistor pairs, and is cross-controlled by the last one (the fourth inverted transistor pair) of the inverted transistor pairs. The inverted transistor pairs and the cascaded transistor pairs are used to provide a plurality of signal propagation delays sequentially, and the input signal S_IN is delayed for a pre-determined time by the inverted transistor pairs and the cascaded transistor pairs which are operated sequentially, thereby creating an output signal S_OUT corresponding to the pre-determined time.

Each of the inverted transistor pairs and the cascaded transistor pairs includes a P-type transistor (such as the first transistor 311, the third transistor 313, the fifth transistor 315, the seventh transistor 317, the ninth transistor 319, the eleventh transistor 321, the thirteenth transistor 323 and the fifteenth transistor 325) and an N-type transistor (such as the second transistor 312, the fourth transistor 314, the sixth transistor 316, the eighth transistor 318, the tenth transistor 320, the twelfth transistor 322, the fourteenth transistor 324 and the sixteenth transistor 326), and P-type transistors and N-type transistors in the inverted transistor pairs and the cascaded transistor pair propagate a signal in a cross manner. That is, the P-type transistors and the N-type transistors in the inverted transistor pairs and the cascaded transistor pair cannot be turned on simultaneously, and each of them control a different type transistor of the next stage in a cross manner (for example, the output of an N-type transistor controls a P-type transistor of the next stage, or the output of a P-type transistor controls a N-type transistor of the next stage) to propagate a signal.

In operation, if the input end receives a low voltage level input signal S_IN, this low voltage level input signal S_IN enables the first transistor 311 to be turned on. Meanwhile, a node A is pulled up to a high voltage level, and enables the fourth transistor 314 to be turned on. Thereafter, a node D is pulled down to a low voltage level, and enables the fifth transistor 315 to be turned on. Then, a node E is pulled up to a high voltage level, and enables the eighth transistor 318 to be turned on. Subsequently, the node H is pulled down to a low voltage level, and enables the ninth transistor 319 to be turned on. Thereafter, a node I is pulled up to a high voltage level, and enables the twelfth transistor 322 to be turned on. Then, a node J is pulled down to a low voltage level, and enables the thirteenth transistor 323 to be turned on. Subsequently, a node K is pulled up to a high voltage level, and enables the sixteenth transistor 326 to be turned on. Thereafter, a node L is pulled down to a low voltage level, and outputs a low voltage level output signal S_OUT.

Therefore, the first transistor 311, the fourth transistor 314, the fifth transistor 315, the eighth transistor 318, the ninth transistor 319, the twelfth transistor 322, the thirteenth transistor 323 and the sixteenth transistor 326 provide time of eight signal propagation delays, such that after the input signal S_IN is delayed by the time of eight signal propagation delays, a corresponding output signal S_OUT is outputted through the output end.

By the same token, if the input end receives a high voltage level input signal S_IN, the operation manner of the signal propagation of this embodiment is also the same as or similar to that in the foregoing embodiment, and thus is not described again herein. It can be known from this description that, the second transistor 312, the third transistor 313, the sixth transistor 316, the seventh transistor 317, the tenth transistor 320, the eleventh transistor 321, the fourteenth transistor 324 and the fifteenth transistor 325 also provide time of eight signal propagation delays, such that after the input signal S_IN is delayed by the time of eight signal propagation delays, a corresponding output signal S_OUT is outputted through the output end.

It should be noted that, in this embodiment, multiple inverted transistors and multiple cascaded transistors are used to increase the number of series-connection stages of the transistors in a horizontal extension manner, thereby increasing the signal propagation delay time. Compared with a conventional delay cell formed from inverters, under the same power consumption, the signal propagation delay time created by this embodiment may be double as much as the delay time created by the conventional delay cell.

Figure 4:
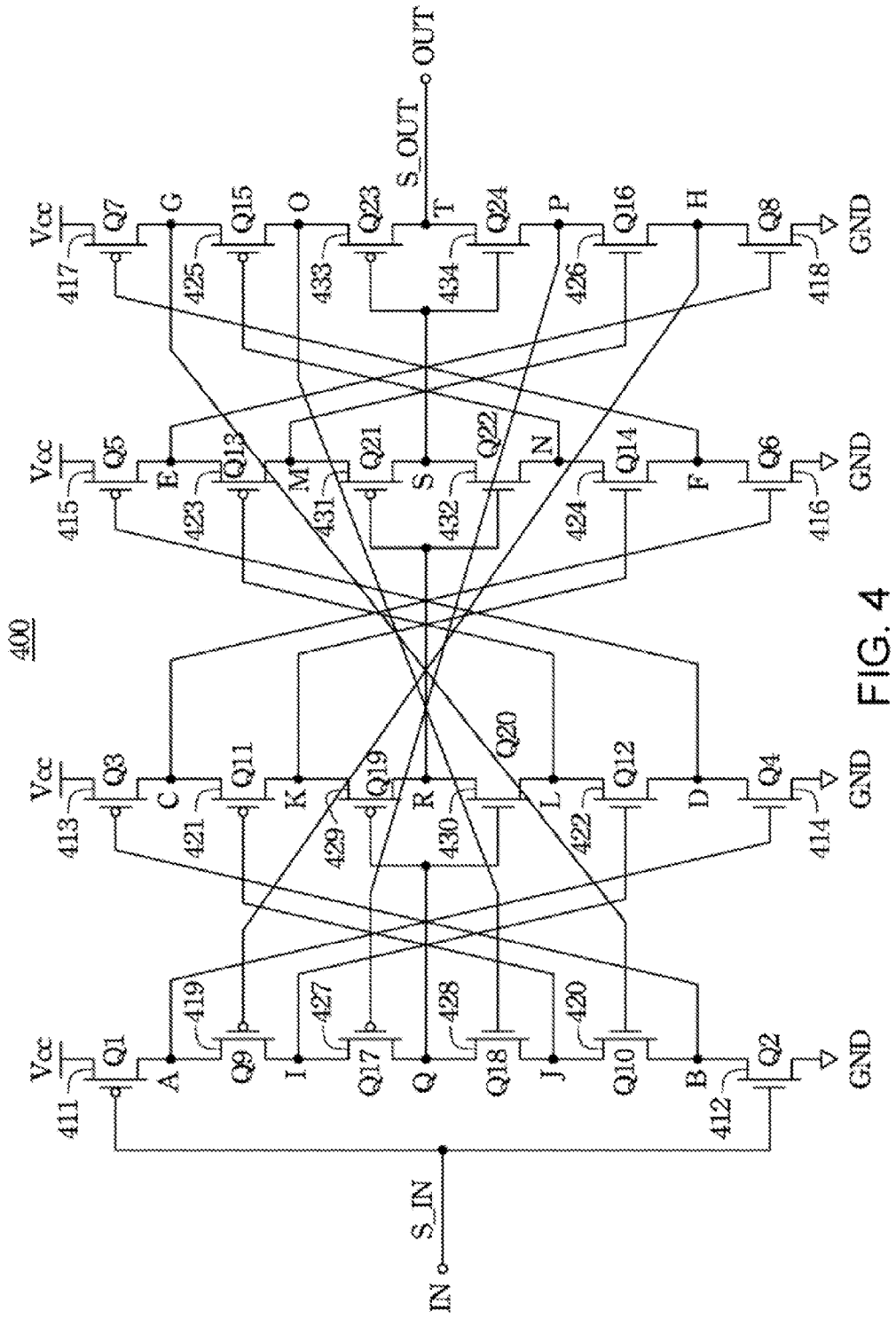
FIG. 4 is a schematic block circuit diagram of a delay cell according to an embodiment of the present disclosure.

Furthermore, multiple inverted transistors and multiple cascaded transistors may be used to increase the number of series-connection stages of the transistors in a horizontal extension manner and a perpendicularly cascaded manner, as shown in FIG. 4. FIG. 4 is a schematic block circuit diagram of a delay cell 400 according to an embodiment of the present disclosure. In this embodiment, the delay cell 400 increases the number of series-connection stages of transistors in combination with the perpendicularly cascaded manner shown in FIG. 2A to FIG. 2C and the horizontal extension manner shown in FIG. 3, thereby greatly increasing the signal propagation delay time, and under the same power consumption, with the signal propagation delay time greatly increased, and the operation manner of this embodiment is the same as or is similar to that of the foregoing embodiment, and thus is not described again herein.

In an embodiment of the present disclosure, the delay cell 300 and the delay cell 400 may further include a bypass unit (not shown) connected in parallel to a cascaded transistor pair. When the bypass unit is switched to an ON state, the bypass unit may remove stored charges in the P-type transistor and the N-type transistor of each of the cascaded transistor pairs. In an embodiment, the bypass unit may include a plurality of bypass transistors (not shown), and the bypass transistors are coupled to each other in a parallel-connection manner or cascaded manner, and the operation manner of this embodiment for removing stored charges is the same as or similar to those of the embodiments shown in FIG. 1B, FIG. 1C, FIG. 2B and FIG. 2C, and thus is not described again herein.

Figure 5:
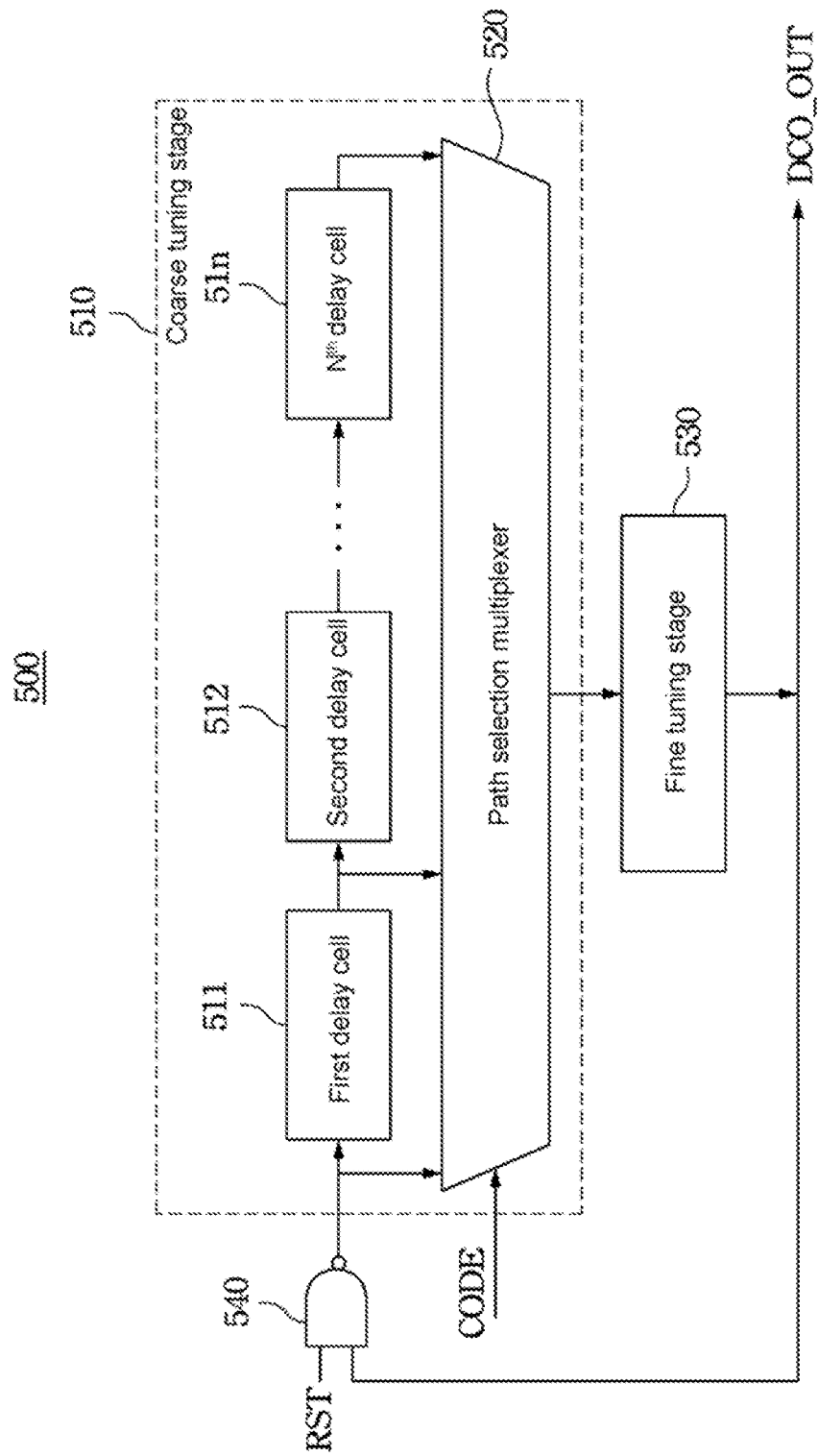
FIG. 5 is a schematic block circuit diagram of a digitally controlled oscillator according to an embodiment of the present disclosure.

FIG. 5 is a schematic block circuit diagram of a digitally controlled oscillator 500 according to an embodiment of the present disclosure. The digitally controlled oscillator 500 may include a coarse tuning stage 510, a fine tuning stage 530 and a NAND gate 540. The coarse tuning stage 510 includes a plurality of delay cells (such as: a first delay cell 511 to an $N^{th}$ delay cell 51n) and a path selection multiplexer 520, and the delay cells in the coarse tuning stage 510 have a long delay time and a long propagation path. Similarly, the fine tuning stage 530 may also include a plurality of delay cells, and the delay cells in the fine tuning stage 530 have a short delay time and a short propagation path. In this embodiment, an oscillation frequency may be created according to signal propagation delay characteristics of the delay cells in the coarse tuning stage 510 or the fine tuning stage 530 and a signal feedback of the NAND gate 540. The magnitude of the oscillation frequency depends on the length of a signal propagation path, and the path selection multiplexer 520 may select the coarse tuning stage 510 or the fine tuning stage 530 according to a control code, so as to obtain different signal propagation paths, thereby generating different oscillation frequencies and resolutions.

Each of the delay cells of the coarse tuning stage 510 may include a plurality of inverted transistor pairs and a plurality of cascaded transistor pairs, and the connection manner and the operation method of this embodiment are the same as or similar to those of the embodiments shown in FIG. 1A to FIG. 4, and thus are not described again herein.

Compared with the prior art, in the embodiments of the present disclosure, through P/N transistor pairs which have cross delay paths and are cascaded to each other, longer signal propagation delay can be achieved under the same power consumption. Moreover, the P/N transistor pairs can also create longer and controllable signal propagation delay in a horizontal extension manner, perpendicularly cascaded manner or a combination thereof.

In view of the foregoing description, advantages of applying the present disclosure lie in that, long delay time is created with a CMOS delay cell of low power consumption, and required signal propagation delay is achieved under low power and small area, and the present disclosure can be widely applied to a digital phase-locked loop, and to an oscillator as well as a delay line utilizing the delay loop design.

Although the present disclosure is disclosed with reference to embodiments above, the embodiments are not intended to limit the present disclosure. Various variations and modifications can be made by persons skilled in the art without departing from the spirit and the scope of the present disclosure, so the protection scope of the present disclosure should be subject to what is defined in appended claims.

What is claimed is:

1. A delay cell, comprising:
   a first inverted transistor pair for receiving an input signal;
   a second inverted transistor pair which is cross-coupled to the first inverted transistor pair and is cross-controlled by the first inverted transistor pair; and
   a plurality of delay units respectively cascaded between the first inverted transistor pair and between the second inverted transistor pair, thereby providing a plurality of signal propagation delays sequentially,
   wherein, the input signal is delayed for a pre-determined time by the first inverted transistor pair, the second inverted transistor pair and the delay units which are operated sequentially, thereby creating an output signal corresponding to the pre-determined time.

2. The delay cell of claim 1, wherein the first inverted transistor pair comprises:
   a first transistor having a gate, a drain and a source, wherein the gate of the first transistor is electrically coupled to an input end, and the source of the first transistor is electrically coupled to a relatively high level voltage; and
   a second transistor having a gate, a drain and a source, wherein the gate of the second transistor is electrically coupled to the input end, and the source of the second transistor is electrically coupled to a relatively low level voltage, wherein the first transistor is a P-type transistor, and the second transistor is an N-type transistor.

3. The delay cell of claim 2, wherein the second inverted transistor pair comprises:
a third transistor having a gate, a drain and a source, wherein the gate of the third transistor is electrically coupled to the drain of the second transistor, and the source of the third transistor is electrically coupled to the relatively high level voltage; and
a fourth transistor having a gate, a drain and a source, wherein the gate of the fourth transistor is electrically coupled to the drain of the first transistor, and the source of the fourth transistor is electrically coupled to the relatively low level voltage,
wherein the third transistor is a P-type transistor, and the fourth transistor is an N-type transistor.

4. The delay cell of claim 3, wherein the delay units comprise:
a first cascaded transistor pair cascaded between the first transistor and the second transistor of the first inverted transistor pair, wherein the first cascaded transistor pair is cross-coupled to the second inverted transistor pair and is cross-controlled by the second inverted transistor pair; and
a second cascaded transistor pair cascaded between the third transistor and the fourth transistor of the second inverted transistor pair, wherein the second cascaded transistor pair is electrically coupled to the first cascaded transistor pair and an output end and is controlled by the first cascaded transistor pair.

5. The delay cell of claim 4, wherein the first cascaded transistor pair comprises:
a fifth transistor having a gate, a drain and a source, wherein the gate of the fifth transistor is electrically coupled to the drain of the fourth transistor, and the source of the fifth transistor is electrically coupled to the drain of the first transistor and the gate of the fourth transistor; and
a sixth transistor having a gate, a drain and a source, wherein the gate of the sixth transistor is electrically coupled to the drain of the third transistor, and the drain of the sixth transistor is electrically coupled to the drain of the fifth transistor, and the source of the sixth transistor is electrically coupled to the drain of the second transistor and the gate of the third transistor,
wherein the fifth transistor is a P-type transistor, and the sixth transistor is an N-type transistor.

6. The delay cell of claim 5, wherein the second cascaded transistor pair comprises:
a seventh transistor having a gate, a drain and a source, wherein the gate of the seventh transistor is electrically coupled to the fifth transistor and the drain of the sixth transistor, and the drain of the seventh transistor is electrically coupled to the output end, and the source of the seventh transistor is electrically coupled to the drain of the third transistor and the gate of the sixth transistor, and
an eighth transistor having a gate, a drain and a source, wherein the gate of the eighth transistor is electrically coupled to the gate of the seventh transistor, and the drain of the fifth transistor and the drain of the sixth transistor, and the drain of the eighth transistor is electrically coupled to the drain of the seventh transistor and the output end, and the source of the eighth transistor is electrically coupled to the drain of the fourth transistor and the gate of the fifth transistor,
wherein the seventh transistor is a P-type transistor, and the eighth transistor is an N-type transistor.

7. The delay cell of claim 6, further comprising:
a bypass unit connected in parallel to the first and second cascaded transistor pairs, wherein the bypass unit is switched to an ON state, so as to remove stored charges in the P-type transistor and the N-type transistor of each of the first and second cascaded transistor pairs.

8. The delay cell of claim 7, wherein the bypass unit comprises a plurality of bypass transistors, and the bypass transistors are coupled to each other in a parallel-connection manner or a cascaded manner.

9. The delay cell of claim 3, wherein the delay units comprise:
a plurality of cascaded transistor pairs respectively cascaded between the first inverted transistor pair and between the second inverted transistor pair, wherein the cascaded transistor pairs are connected in series sequentially, and a first one of the cascaded transistor pairs is cross-coupled to the second inverted transistor pair and is cross-controlled by the second inverted transistor pair, and a last one of the cascaded transistor pairs is electrically coupled to an output end,
wherein except for the last one of the cascaded transistor pairs, the rest of the cascaded transistor pairs are connected in series in a cross-coupled manner and are cross-controlled sequentially.

10. The delay cell of claim 9, wherein each of the cascaded transistor pairs comprises a P-type transistor and an N-type transistor, and the P-type transistor and the N-type transistor in each of the first inverted transistor pair, the second inverted transistor pair and the cascaded transistor pairs propagate a signal in a cross manner.

11. The delay cell of claim 10, further comprising:
a bypass unit connected in parallel to the cascaded transistor pairs, wherein the bypass unit is switched to an ON state, so as to remove stored charges in the P-type transistor and the N-type transistor of each of the cascaded transistor pairs.

12. The delay cell of claim 11, wherein the bypass unit comprises a plurality of bypass transistors, and the bypass transistors are coupled to each other in a parallel-connection manner or a cascaded manner.

13. A delay cell, comprising:
a plurality of inverted transistor pairs which are connected in series in a cross-coupled manner and are cross-controlled sequentially, wherein a first one of the inverted transistor pairs is used to receive an input signal; and
a plurality of cascaded transistor pairs cascaded between the inverted transistor pairs, wherein the cascaded transistor pairs are connected in series sequentially, and a first one of the cascaded transistor pairs is cross-coupled to a last one of the inverted transistor pairs and is cross-controlled by the last one of the inverted transistor pairs,
wherein the inverted transistor pairs and the cascaded transistor pairs are used to provide a plurality of signal propagation delays sequentially, and the input signal is delayed for a pre-determined time by the inverted transistor pairs and the cascaded transistor pairs which are operated sequentially, thereby creating an output signal corresponding to the pre-determined time.

14. The delay cell of claim 13, wherein each of the inverted transistor pairs and the cascaded transistor pairs comprises a P-type transistor and an N-type transistor, and the P-type transistor and the N-type transistor in each of the inverted transistor pairs and the cascaded transistor pairs propagate a signal in a cross manner.

15. The delay cell of claim 14, further comprising:
a bypass unit connected in parallel to the cascaded transistor pairs, wherein the bypass unit is switched to an ON state, so as to remove stored charges in the P-type transistor and the N-type transistor of each of the cascaded transistor pairs.

16. The delay cell of claim 15, wherein the bypass unit comprises a plurality of bypass transistors, and the bypass transistors are coupled to each other in a parallel-connection manner or a cascaded manner.

17. A digitally controlled oscillator comprising a plurality of delay cells, wherein each of the delay cells comprises:
a plurality of inverted transistor pairs which are connected in series in a cross-coupled manner and are cross-controlled sequentially, wherein a first one of the inverted transistor pairs is used to receive an input signal; and
a plurality of cascaded transistor pairs respectively cascaded between corresponding ones of the inverted transistor pairs, wherein the cascaded transistor pairs are connected in series sequentially, and a first one of the cascaded transistor pairs is cross-coupled to a last one of the inverted transistor pairs and is cross-controlled by the last one of the inverted transistor pairs,
wherein the inverted transistor pairs and the cascaded transistor pairs are used to provide a plurality of signal propagation delays sequentially, and the input signal is delayed for a pre-determined time by the inverted transistor pairs and the cascaded transistor pairs which are operated sequentially, thereby creating an output signal corresponding to the pre-determined time.

18. The digitally controlled oscillator of claim 17, wherein each of the inverted transistor pairs and the cascaded transistor pairs comprises a P-type transistor and an N-type transistor, and the P-type transistor and the N-type transistor in each of the inverted transistor pairs and the cascaded transistor pairs propagate a signal in a cross manner.

19. The digitally controlled oscillator of claim 18, further comprising:
a bypass unit connected in parallel to the cascaded transistor pairs, wherein the bypass unit is switched to an ON state, so as to remove stored charges in the P-type transistor and the N-type transistor of each of the cascaded transistor pairs.

20. The digitally controlled oscillator of claim 19, wherein the bypass unit comprises a plurality of bypass transistors, and the bypass transistors are coupled to each other in a parallel-connection manner or a cascaded manner.

* * * * *